United States Patent
Coppens

(10) Patent No.: US 7,482,267 B2
(45) Date of Patent: Jan. 27, 2009

(54) ION IMPLANTATION OF SPIN ON GLASS MATERIALS

(75) Inventor: Peter Coppens, Kanegem (BE)

(73) Assignee: AMI Semiconductor Belgium BVBA, Westerring, Oudenaarde (BE)

(*) Notice: Subject to any disclaimer, the term of this patent is extended or adjusted under 35 U.S.C. 154(b) by 0 days.

(21) Appl. No.: 11/407,938

(22) Filed: Apr. 21, 2006

(65) Prior Publication Data
US 2006/0252259 A1    Nov. 9, 2006

(30) Foreign Application Priority Data
Apr. 22, 2005    (EP) .................................. 05447087

(51) Int. Cl.
H01L 21/4763    (2006.01)
(52) U.S. Cl. ............... 438/640; 257/634; 257/E21.275; 438/514
(58) Field of Classification Search ................ 438/624, 438/510, 473, 704, 735, 623, 514, 627; 257/758, 257/634, E21.275
See application file for complete search history.

(56) References Cited

U.S. PATENT DOCUMENTS

| 5,177,588 | A  |   | 1/1993  | Yoriko, II et al. |
| 5,192,697 | A  |   | 3/1993  | Leong |
| 5,429,990 | A  |   | 7/1995  | Liu et al. |
| 5,459,086 | A  | * | 10/1995 | Yang ........................... 438/624 |
| 5,496,776 | A  |   | 3/1996  | Chien et al. |
| 5,643,407 | A  | * | 7/1997  | Chang ......................... 438/623 |
| 6,001,745 | A  |   | 12/1999 | Tu et al. |
| 6,225,204 | B1 |   | 5/2001  | Wu et al. |
| 6,319,797 | B1 |   | 11/2001 | Usami |
| 2003/0013296 | A1 |   | 1/2003 | Apelgren et al. |

OTHER PUBLICATIONS

Patent Abstracts of Japan, vol. 2000, No. 26, Jul. 1, 2002 & JP 2001 267418 A (Sanyo Electric Co Ltd), Sep. 28, 2001 *abstract*.

* cited by examiner

Primary Examiner—Asok K Sarkar

(57) ABSTRACT

A spin on glass SOG layer 30 is formed, then a PECVD barrier layer 40 over the SOG layer. Holes 50 in the SOG layer for vias are formed with a wine glass profile, so that in a peripheral region around the periphery of the holes, the barrier layer is thinner or absent, and ion implantation is performed substantially perpendicular to the layers, to reach the SOG layer through the barrier layer preferentially in the peripheral region. This enables the implantation to be concentrated on the peripheral region, without the need for implantation at a high angle and wafer rotation. This enables the manufacturing process to be simplified and hence costs reduced. By concentrating the implantation in the peripheral region where it can reduce moisture transfer to material in the holes, there is less risk of deplanarization due to the SOG shrinkage associated with ion implantation.

20 Claims, 3 Drawing Sheets

ION IMPLANTATION OF SPIN ON GLASS MATERIALS

FIELD OF THE INVENTION

This invention relates to methods of forming structures having spin on glass layers, and to corresponding structures produced.

DESCRIPTION OF THE RELATED ART

It is known to use spin-on-glass (SOG) materials for planarization of integrated circuits. A typical process for applying an SOG layer includes liquefying the SOG material, e.g. by suspending the material in a solvent, depositing it onto the semiconductor wafer surface and spinning the wafer to spread it uniformly. The material fills the indentations in the integrated circuit wafer surface to achieve planarization. Most of the solvent is then driven off by a low temperature baking step. A degassing step at atmospheric pressure in nitrogen and 450° C. or in a vacuum of less than about 100 mtorr and 350 degrees C. can help remove harmful chemical materials. Other coatings of the spin-on-glass material can be applied, baked and vacuum degassed until the desired spin-on-glass layer is formed. A final step involves curing or heating to cause the breakdown of the silicate or siloxane SOG material to a silicon dioxide like cross linked material. SOG is known to absorb moisture or other gases. During the subsequent deposition of the top metal in a via, this moisture and other gases can be released from the exposed SOG layer in the sidewall of the via to react with the deposited metal and to cause a so-called poisoned via. Ion implantation of the SOG has been reported as a solution for the poisoned via problem in U.S. Pat. Nos. 5,429,990 and 5,496,776. The ion implantation further cures the SOG material and so prevents the absorption and release of moisture. Both patents however propose to do the implant blanket after SOG coat or etchback, and before the SOG layer is covered. During the implantation however, the SOG shrinks with almost 20% according to 5,192,697 (more with higher implant energy). Another method would be to implant the SOG after via etching and after laying a coating over the SOG material. Pat. No. 5,459,086 describes such a method in which a large tilt angle full rotational implant is used, so that the ions strike the vertical sidewalls of the vias, where the SOG is exposed. In this disclosure the vias have a completely vertical side, so a large tilt angle full rotational implant (at least 20° is mentioned in the patent) is needed. There remains a need for improved methods.

SUMMARY OF THE INVENTION

An object of the invention is to provide improved methods of forming structures having spin on glass layers, and to corresponding structures produced. According to a first aspect, the invention provides a method of manufacturing parts of an electronic device, e.g. a semiconductor device such as an integrated circuit, which can comprise a substrate such as a semiconductor wafer, the method having the steps of forming a spin on glass SOG layer, forming a barrier layer over the SOG layer, forming holes or patterns in the SOG layer, so that in a peripheral region around the periphery of the holes or patterns, the barrier layer is thinner or absent, compared to other regions away from the peripheral region, and performing ion implantation substantially perpendicular to the layers, to reach the SOG layer through the barrier layer preferentially in the peripheral region, e.g. only in a peripheral region of the SOG layer. In an uncovered SOG layer the implantation can go about 3000-3500 Å deep. When the SOG layer is covered, e.g. by a PECVD layer of about 1000 Å thick (which is about the thickness in the periphery of the vias, where the PECVD layer has been thinned by the isotropic part of the via etching) the implantation can go about 1500-2000 Å deep. This is based on an implant energy of 180 keV. The implantation will go deeper with higher implant energies. The barrier layer may be a single layer of only one material.

Also the sideways penetration of the doped region into the SOG layer from the via is preferably greater than 500, and can be greater than 1000 Å. This sideways penetration is determined by the scale, shape and size of the covering of the SOG layer adjacent to the via.

This enables the implantation of the SOG region to be across the complete thickness of the SOG layer and concentrated at the peripheral region, without the need for implantation at a high angle and rotation of the wafer. If the implantation is not substantially perpendicular, then the concentration of ions on a sloping part of the surface will be dependent on the orientation of the slope, and so wafer rotation would be needed to provide equal concentrations on slopes having different orientations. Avoiding wafer rotation enables the manufacturing process to be simplified and hence costs reduced. Potentially it also enables use of narrower holes, with less risk of shadowing effects, or use of holes or patterns which are not rotationally symmetrical. The implantation can also be carried out more quickly. An extra advantage is that when doing the implantation perpendicularly through the barrier layer a much larger area can be implanted, depending on how large the area is where the barrier layer is thinner. For a tilt angle implant in completely vertical vias the implanted area is only dependent on the implant energy and limited by the shadowing effects. This is illustrated by FIG. 3 and FIG. 4.

By concentrating the implantation in the peripheral region where it is needed to reduce the problem of moisture transfer to material in the holes or patterns, there is less risk of deplanarization due to the SOG shrinkage associated with ion implantation over a wider region. This shrinkage partially cancels out the planarizing properties of SOG and can lead to unacceptable deplanarization. The present invention is based on a new realization that shrinkage from ion implantation can cause this deplanarising effect. U.S. Pat. No. 5,192,697 mentions the shrinkage, but without considering this as a disadvantage, or considering that it can cause deplanarising. U.S. Pat. No. 5,459,086 discloses a self aligned SOG implantation, but also without realising that the avoidance of the shrinkage causes less risk of deplanarization.

An additional feature of some (but not all) embodiments is the step of forming holes or patterns having the steps of forming a patterned etch resist layer, followed by isotropic etching and anisotropic etching. An advantage of the present invention is that only a single masking layer is used.

This is one way to achieve a profile of the barrier layer at the peripheral region which is thinner to enable the preferential ion implantation, and also enable better step coverage of the barrier layer by subsequent layers.

Another such additional feature is the barrier layer comprising an insulating layer especially an oxide layer such as a CVD oxide layer. CVD encompasses a number of well established methods of forming such layers, including PECVD for example.

Another such additional feature is the other regions of the barrier layer having a thickness greater than 4000 Å, and the peripheral region having a thickness less than 1500 Å.

Another such additional feature is the ion implantation being applied in sufficient dosage and energy to cause structural changes within the spin-on-glass layer to cause the spin-on-glass layer in the peripheral region to be not susceptible to moisture sorption and outgassing.

Another such additional feature is the ion implantation comprising implantation of any of Ar, B, F, P, N, O, As, Si.

Another such additional feature is the preliminary step of forming a bottom metal layer and a lower barrier layer before forming the SOG layer.

Another such additional feature is a step of forming a top metal layer in the holes or patterns.

Another such additional feature is the holes or patterns having a profile in the shape of a wine glass. For example, the surface form results from the anisotrpic etch step and can be circular or parabolic in form resulting in a lower thickness close to the via and a larger thickness away from the via.

Another aspect of the invention provides an electronic device, e.g. a semiconductor device of which one example is an integrated circuit structure, having a spin on glass (SOG) layer, a barrier layer over the SOG layer, holes or patterns in the SOG layer, formed so that in a peripheral region around the periphery of the holes or patterns, the barrier layer is thinner or absent, compared to other regions away from the peripheral region, the SOG layer having implanted ions, concentrated preferentially in the peripheral region, e.g. only in the peripheral and not elsewhere.

Another such additional feature is the barrier layer comprising an insulating layer such as an oxide of which a CVD oxide layer is one example.

Another such additional feature is the other regions of the barrier layer having a thickness greater than 4000 Å, and the peripheral region having a thickness less than 1500 Å.

Another such additional feature is a bottom metal layer and a lower barrier layer below the SOG layer.

Another such additional feature is a top metal layer in the holes or patterns.

Another such additional feature is the holes or patterns having a profile in the shape of a wine glass.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, all of which relate to embodiments of the present invention, in which.

DESCRIPTION OF EMBODIMENTS

Figure 1:
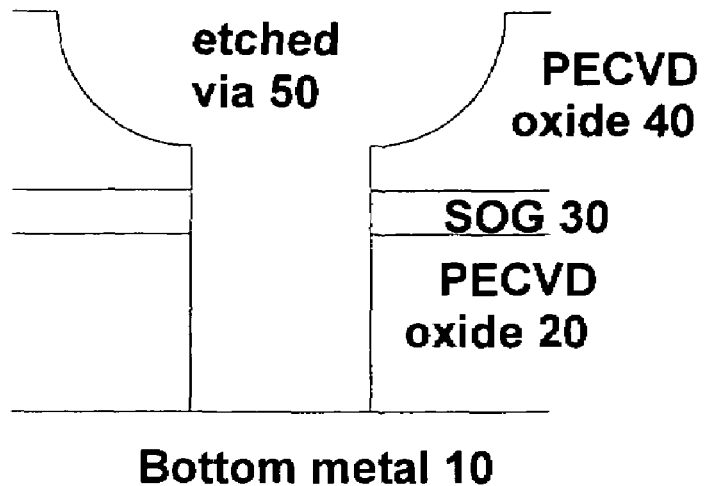
FIG. 1 shows a schematic cross section view of a patterned via.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

It is furthermore to be noticed that the term "comprising", used in the description and in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Figure 2:
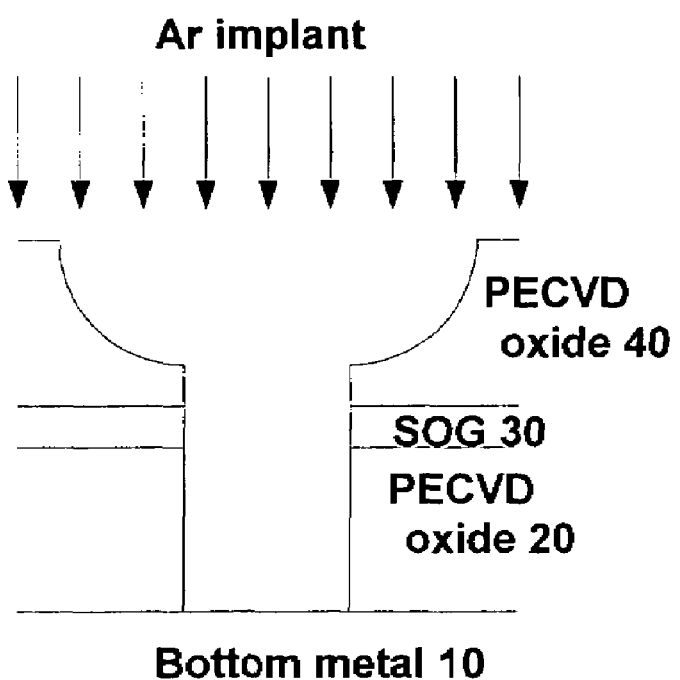
FIG. 2 shows the same view, during blanket implantation substantially perpendicular, at 0° angle
Figure 3:
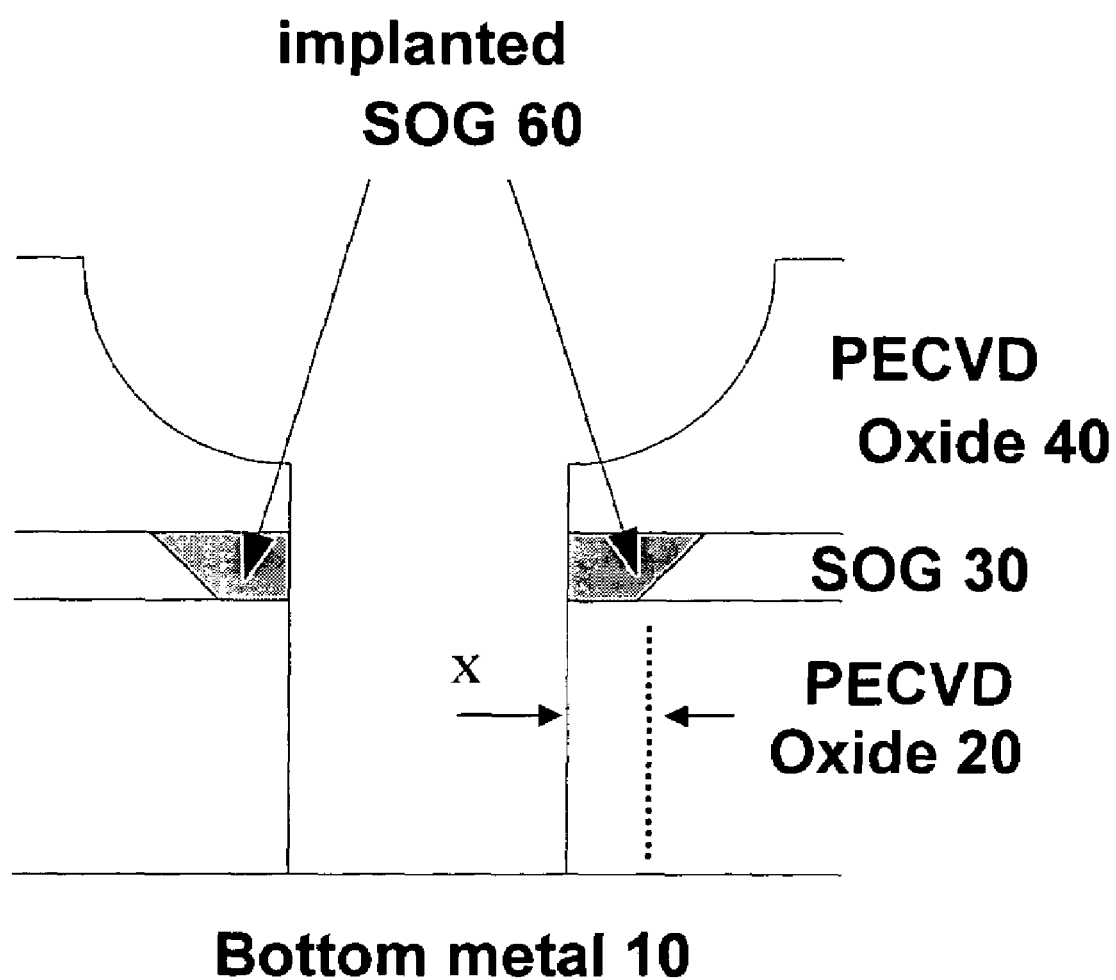
FIG. 3 shows the same view after the implantation.
Figure 4:
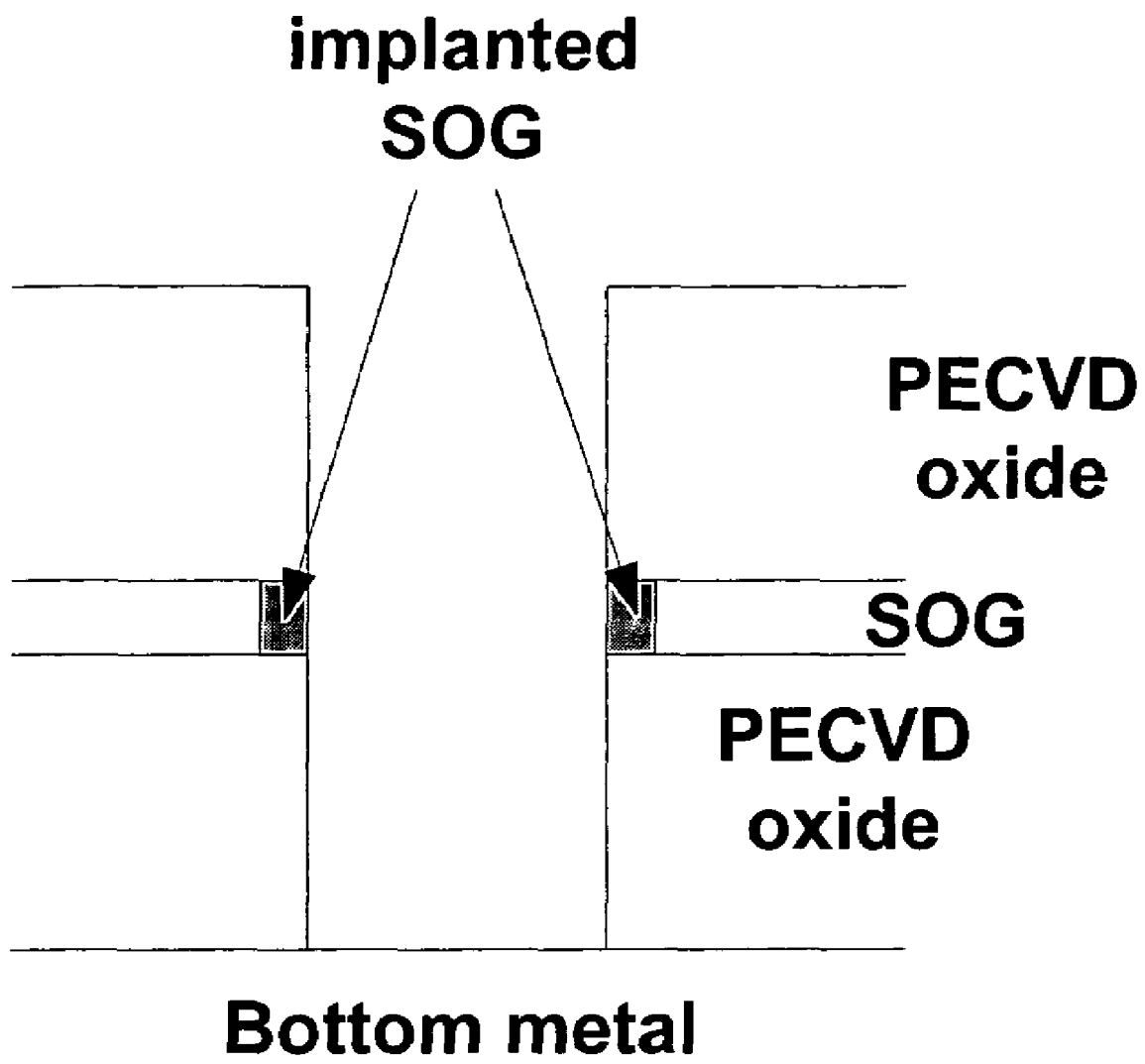
FIG. 4 shows the implantation profile as obtained with a tilted angle implantation.

Steps of a method according to a first embodiment of the invention are illustrated in FIGS. 1 to 3. In the figures, FIG. 1 shows a schematic view of a patterned via. There is a bottom conductive layer such as a metal layer 10. This layer is applied on a substrate (not shown). Any suitable substrate may be used of which a semiconductor wafer is one example. The stack of layers comprises in addition: a first barrier or insulating layer, e.g. an oxide layer, of which a Plasma Enhanced Chemical Vapor Deposition (PECVD) oxide layer 20 is an example, a SOG layer (e.g. with etchback) 30, a second barrier or insulating layer such as an oxide layer of which a second PECVD layer 40 is an example and a via 50 patterned and etched both isotropically and anisotropically, causing a wine glass shape.

FIG. 2 shows the same structure during blanket implantation at 0°. The second PECVD oxide layer blocks the implantation, except in the via holes where the PECVD oxide is too thin. FIG. 3 shows the same structure after the implantation. Only the SOG underneath the wine glass shape was exposed to the implant over a distance "x" and was extra-cured, preventing outgassing.

A more detailed description of the steps now follows. As shown in FIG. 1, via processing starts from the patterning of a bottom conductive layer, e.g. of a bottom metal layer. This bottom layer is on a substrate (not shown). Any suitable substrate may be used, of which a semiconductor wafer is one example. To planarize the steps left by this metal pattern a SOG is applied, e.g. as an intermetal dielectric. It consists of a lower barrier layer such as an oxide layer, typically formed by a CVD process such as PECVD, shown as first PECVD oxide of 4000 Å (e.g. range 2000-7000 Å). On top of this first layer a spin-on-glass (SOG) layer is coated, which has the ability to planarize the surface. This can be done in two passes and leaves a total SOG thickness of about 4800 Å on an unpatterned wafer (e.g. range 2000-7000 Å). Since the SOG is fluid, all moisture needs to be baked out. This can be done on hot plates, e.g. three hot plates with increasing temperature followed by a cure of 1 h at 420° C. After the cure the SOG is partially etched back, leaving in large open areas remaining SOG with a thickness of about 1500 Å (for a partial etchback process: max. 3000 Å, for a non-etchback approach : range 2000-7000 Å). Finally a second PECVD oxide layer of 5500 Å is deposited (e.g. thickness range 4000-7000 Å).

After the intermetal dielectric module the vias are patterned. After a lithographic step, e.g. comprising forming a mask such as a resist coating, lithographic exposure and development, vias are etched. Only a single mask layer needs to be formed. The etching preferably forms a wine glass shape. The etching is preferably carried out in two steps. In a first etch step the via is etched isotropically (e.g. an omnidirectional etch) for about 4500 Å. For example, 60-80% of its original thickness is removed, max. 2000 Å remaining, in the second step the etching is completed anisotropically (e.g. in a unidirectional manner) to remove the remaining oxide. As a result the via has a wine glass shape (see FIG. 1). After the etching the resist and etching polymers are removed during a dry strip and a wet solvent clean.

After the complete via formation and cleaning, ion implantation is carried out. Self-aligned ion implantation is preferable. The ion implantation may be carried out with any suitable dopant of which Ar, B, F, P, N, O, As, and Si are only examples.

For example, this implantation can be done with a dose of 1e15 of Ar * (range 1e14-1e16) and at an energy of 180 keV (range 120-270 keV) (represented by FIG. 2). Thanks to the wine glass shape of the vias the implantation ions, e.g. Ar atoms are blocked by the top PECVD layer, except in the vias where the PECVD thickness is reduced to about 1000 Å (max. 2000 Å). Only there the implantation ions, e.g. Ar atoms can penetrate the SOG and lead to an additional cure of the SOG (as shown in FIG. 3). This can help prevent via poisoning caused by ion implantation of the SOG, with less risk. The lateral implant into the SOG layer from the via of at least 500, an possibly more than 1000 Angströms reliably prevents problems with moisture sorption and outgassing.

In an uncovered SOG layer the implantation can go about 300-350 nm deep. When the SOG layer is covered, e.g. by a PECVD layer of about 100 nm thick (which is about the thickness in the periphery of the vias, where the PECVD layer has been thinned by the isotropic part of the via etching) the implantation can go about 150-200 nm deep. This is based on an implant energy of 180 keV. The implantation will go deeper with higher implant energies. In accordance with embodiments of the present invention the implant depth in the SOG layer is less than 2000 n, e.g. 1000 nm deep or less.

A further aspect of the present invention is the lateral extension of the implant (best seen as the dimension "x" in FIG. 3. Lateral extension of the SOG implant is a function of the opening in the PECVD oxide layer 40. The first etch step in which the via is etched isotropically (e.g. an omnidirectional etch) for about 4500 Å and, for example, 60-80% of its original thickness is removed, means that max. 2000 Å remains. In the second step the etching is completed anisotropically (e.g. in a unidirectional manner) to remove the remaining oxide. With the first ecth being isotropic, removal of 4500 Å in one direction (vertically), will remove the same amount (4500 Å) laterally as well. Removing material laterally, determines the lateral extension of the region where implant will happen. In the above example the implant will extend laterally almost as much as the isotropic etch went deep, e.g. about 4500 Å. In accordance with an aspect of the present invention this lateral extension of the doping into the SOG layer is at least 500, and also possibly more than 1000 Å. The region where SOG implant is possible is the best part of the 4500 Å where the thickness of the PECVD oxide layer 40 is less than a value through which the implant can be made, e.g. less than 2000 Å. For example if the oxide layer 40 has a thickness such as 4000 Å, from which up to 80% is removed there remains 800 Å of PECVD oxide 40 close to the via and this increases in thickness up to 4000 Å. As the isotropic etch may be assumed to form a circular surface and if implant is possible over the region where thickness of the PECVD is less than 2000 Å, this gives us a region that is less than 2000 Å that extends up to about a distance defined by:

the radius of the circular surface defined by the wine glass shape after isotropic etching * cos (the angle between the vertical and the position on the semi-circular cross section where thickness of PECVD layer=2000 Å).

In the example given, this radius is about 3200 Å and the angle is about 30 degrees. The result will be a little less than 2700 Å. Of course, the estimate is based on the assumption that the isotropic etching gives an semicircular cross section. Results remain very close to the above estimate for the lateral extension of the domed region in the SOG layer even when a trapezoidal cross section is assumed for the upper part of the wine glass shaped profile.

Lateral extension is also function of the implant energy. In accordance with an aspect of the present invention this energy may be more than 120 keV (range 120-270 keV). The above results in doping of the SOG layer across its entire thickness and preferentially in the peripheral region, e.g. extending a distance X from the wall of the hole etched anisotropically in PECVD oxide 20 and 40 to at least 500 Å, possibly grater than 1000 Å away from the perimeter of that hole (see FIG. 3).

This gives the possibility to do the implant at 0°, meaning that the substrate, e.g. a semiconductor substrate such as a wafer need not be rotated. Thanks to the presence of the bottom conductive, e.g. metal layer the amount of SOG in the via is limited, so the possible shrinkage of the SOG inside the via is also limited. Thanks to the planarizing effect of SOG, more SOG will flow in between the lines of the bottom conductive layer, than the amount of SOG that stays on top of this layer. The amount of SOG on top of the bottom conductive layer is thus limited (purely illustrative: max. 3000 Å). Since all vias are put on top of this layer, meaning to contact this layer with upper conductive layers, only this limited amount of SOG will be implanted and in this way the shrinkage is limited, e.g. purely illustrative example: in absolute value max. 900 Å, with a shrinkage of 30%).

On other locations, where a thicker layer of SOG is possible, no shrinkage is possible thanks to the blocking top PECVD layer. An advantage is that deplanarization cannot occur.

After the implant further processing can be resumed by the deposition of the top conductive layer such as a metal layer.

Any or all of the metal layers may be an Aluminum/Silicon/Copper alloy (Al/Si/Cu) deposited over a Titanium/Tungsten (Ti/W) layer for example or TiN layer. The thickness of the metal layers can be between about 5,000 to about 7,000 Angstroms. Many other metallurgic connections and thicknesses may be used, including but not limited to Aluminum/Silicon, Aluminum/Copper, dual-doped polysilicon, Titanium Silicide, Titanium Nitride, CVD Tungsten and polycides. The metallurgy may be deposited by several methods, including but not limited to evaporation, sputtering and CVD.

This method can be used for submicron technologies having conductor lines spaced from one another by less than a micron. It can be applied to construction of MOSFET semiconductor structures in and on a semiconductor substrate, or to other device technologies.

The embodiments can address the problem of the deplanarizing effect of using an ion implantation of the SOG.

As described above, a spin on glass SOG layer 30 is formed, then a barrier layer is formed of which a PECVD barrier layer 40 over the SOG layer is one example. Holes 50 in the SOG layer for vias are formed with a wine glass profile, so that in a peripheral region around the periphery of the holes, the barrier layer is thinner or absent, and ion implantation is performed substantially perpendicular to the layers, to reach the SOG layer through the barrier layer preferentially in the peripheral region. This enables the implantation to be concentrated on the peripheral region, without the need for implantation at a high angle and wafer rotation. This enables the manufacturing process to be simplified and hence costs reduced. By concentrating the implantation in the peripheral region where it can reduce moisture transfer to material in the holes, there is less risk of deplanarization due to the SOG shrinkage associated with ion implantation. Other variations can be envisaged within the scope of the claims.

The invention claimed is:

1. A method of manufacturing parts of an electronic device, comprising the steps of forming a spin on glass SOG layer, forming a barrier layer over the SOG layer, forming holes or patterns in the SOG layer, so that in a peripheral region around the periphery of the holes or patterns, the barrier layer is thinner or absent, compared to other regions away from the peripheral region, and performing ion implantation substantially perpendicular to the layers, to reach the SOG layer through the barrier layer preferentially in the peripheral region.

2. The method of claim 1, wherein the step of forming a barrier layer forms a single barrier layer made of one material.

3. The method of claim 1, wherein the step of forming holes or patterns generates a wine glass shape.

4. The method of claim 1, wherein the step of forming holes or patterns includes the steps of forming a patterned etch resist layer, followed by the isotropic etching and anisotropic etching.

5. The method of claim 1, the barrier layer comprising a CVD oxide layer.

6. The method of claim 1, the other regions of the barrier layer having a thickness greater than 4000 Å, and the peripheral region having a thickness less than 1500 Å.

7. The method of claim 1, the ion implantation being applied in sufficient dosage and energy to cause structural changes within the spin-on-glass layer to cause the spin-on-glass layer in the peripheral region to be not susceptible to moisture sorption and outgassing.

8. The method of claim 7, wherein a lateral extension of the structural changes within the spin-on glass layer by applying a dosage and energy is at least 500 Å, or more than 1000 Å.

9. The method of claim 7, wherein a lateral extension of the structural changes within the spin-on-glass layer by applying a dosage and energy more than 1000 Å.

10. The method of claim 1, the ion implantation comprising any of the group consisting of Ar, B, F, P, N, O, As, and Si.

11. The method of claim 1, including the preliminary step of forming a bottom conductive layer and a lower barrier layer before forming the SOG layer.

12. The method of claim 1, including a step of forming a top conductive layer in the holes or patterns.

13. The method of claim 1, wherein the implantation is across the complete thickness of the SOG layer.

14. An integrated circuit structure, comprising a spin on glass (SOG) layer, a barrier layer over the SOG layer, holes or patterns in the SOG layer, said holes or patterns formed so that in a peripheral region around the periphery of the holes or patterns, the barrier layer is thinner or absent, compared to other regions away from the peripheral region, the SOG layer having ions implanted, the other regions of the barrier layer having a thickness greater than 4000 Å and the peripheral region having a thickness less than 1500 Å and wherein a lateral extension of the structural changes within the spin-off-glass layer is at least 500 Å.

15. The circuit structure of claim 14, the barrier layer comprising a CVD oxide layer.

16. The circuit structure of claim 14, comprising a bottom conductive layer and a lower barrier layer below the SOG layer.

17. The circuit structure of claim 14, including a top conductive layer in the holes or patterns.

18. The circuit structure of claim 14, the holes or patterns having a profile in the shape of a wine glass.

19. The circuit structure of claim 14, the SOG layer having ions implanted being such as to cause structural changes within the spin-on-glass layer to cause the spin-on-glass layer in the peripheral region to be not susceptible to moisture sorption and outgassing.

20. The circuit structure of claim 14, wherein a lateral extension of the structural changes within the spin-on-glass layer is more than 1000 Å.

* * * * *